(12) United States Patent
Jang (10) Patent No.: US 9,502,443 B1
(45) Date of Patent: Nov. 22, 2016

(54) SUBSTRATE CUTTING APPARATUS AND METHOD OF MANUFACTURING DISPLAY DEVICE BY USING THE SAME

(71) Applicant: SAMSUNG DISPLAY CO., LTD., Yongin-si, Gyeonggi-do (KR)

(72) Inventor: Joonyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/975,384

(22) Filed: Dec. 18, 2015

(30) Foreign Application Priority Data

Aug. 6, 2015 (KR) .......................... 10-2015-0111207

(51) Int. Cl.
*H01L 27/12* (2006.01)
*H01L 21/683* (2006.01)

(52) U.S. Cl.
CPC .......... *H01L 27/1259* (2013.01); *H01L 21/683* (2013.01)

(58) Field of Classification Search
CPC ............. H01L 51/524; H01L 51/5237; H01L 51/5246; H01L 24/13; H01L 24/45; H01L 24/48; H01L 24/97; H01L 21/561; H01L 21/566; H01L 21/568; H01L 21/6835
See application file for complete search history.

(56) References Cited

U.S. PATENT DOCUMENTS

| 7,357,165 B2* | 4/2008 | Yamamoto ............ B26F 1/3846 156/267 |
| 2011/0223697 A1 | 9/2011 | Yong-Hwan et al. |
| 2015/0209898 A1 | 7/2015 | Kim et al. |

FOREIGN PATENT DOCUMENTS

| JP | 2013-111644 A | 6/2013 |
| KR | 10-0728596 B1 | 6/2007 |
| KR | 10-2011-0101774 A | 9/2011 |
| KR | 10-2012-0013135 A | 2/2012 |
| KR | 10-1358672 B1 | 2/2014 |

* cited by examiner

*Primary Examiner* — Kyoung Lee
(74) *Attorney, Agent, or Firm* — Lewis Roca Rothgerber Christie LLP (57) ABSTRACT

A substrate cutting apparatus includes: a stage configured to support a substrate and including at least one curved portion that extends along a first direction, and flat portions respectively on sides of the curved portion and continuous with the curved portion; and a cutting portion above the stage and configured to cut the substrate in a second direction and along the first direction at a position spaced from a central line of the curved portion in a third direction.

20 Claims, 6 Drawing Sheets

SUBSTRATE CUTTING APPARATUS AND METHOD OF MANUFACTURING DISPLAY DEVICE BY USING THE SAME

CROSS-REFERENCE TO RELATED APPLICATION

This application claims priority to, and the benefit of, Korean Patent Application No. 10-2015-0111207, filed on Aug. 6, 2015, in the Korean Intellectual Property Office, the disclosure of which is incorporated herein in its entirety by reference.

BACKGROUND

1. Field

One or more exemplary embodiments relate to a substrate cutting apparatus, and a method of manufacturing a display device by using the same.

2. Description of the Related Art

Recently, a display device has been gradually replaced with a flat panel display device of a slim profile. The display device may include a plurality of thin films including an inorganic layer or an organic layer, etc. Meanwhile, to improve manufacturing efficiency of a display device, a plurality of display devices may be simultaneously formed by forming a plurality of display areas on a substrate, and by then cutting portions between the display areas of the substrate. However, because a conventional substrate cutting apparatus cuts a substrate such that a cross-section of the substrate after cutting has a vertical cross-section, an inorganic layer, etc. formed on the substrate may be damaged during a cutting process of the substrate.

SUMMARY

One or more exemplary embodiments of the present invention include a substrate cutting apparatus, and a method of manufacturing a display device by using the same.

Additional aspects are set forth in part in the description which follows and, in part, will be apparent from the description, or may be learned by practice of the presented embodiments.

According to one or more exemplary embodiments of the present invention, a substrate cutting apparatus includes: a stage configured to support a substrate and including at least one curved portion that extends along a first direction and flat portions respectively on sides of the curved portion and continuous with the curved portion; and a cutting portion above the stage and configured to cut the substrate in a second direction and along the first direction at a position spaced from a central line of the curved portion in a third direction.

The cutting portion may be configured to cut the substrate at a position that overlaps with the curved portion.

The curved portion may have a convex shape that protrudes outwardly from the flat portions.

The curved portion may have a concave shape recessed inwardly from the flat portions.

The curved portion may have bilateral symmetry about the central line.

A cross-section of the curved portion, the cross-section being perpendicular to the first direction, may include a curve including two inflection points respectively at opposing sides of the central line.

The curve may have a first curvature between the two inflection points.

The cutting portion may be configured to cut the substrate between the two inflection points.

The stage may include a plurality of vacuum holes.

The substrate may include a flexible substrate, and a cross-section of the substrate that is cut by the cutting portion may have an inclined surface.

The cutting portion may be configured to cut the substrate on opposing sides of the central line.

The at least one curved portion may include a plurality of curved portions spaced apart from each other.

According to one or more exemplary embodiments of the present invention, a method of manufacturing a display device includes: forming the display device on a flexible substrate; disposing the flexible substrate on a stage; and cutting the flexible substrate by using a cutting portion, wherein the stage includes at least one curved portion that extends along a first direction, and flat portions respectively on opposing sides of the curved portion and continuous with the curved portion, and wherein the cutting portion cuts the flexible substrate in a second direction at a position that overlaps with the curved portion.

The method may include closely attaching the flexible substrate to the curved portion and to the flat portions by vacuum holes defined by the stage.

The method may include cutting the flexible substrate with the cutting portion along the first direction at a position spaced apart from a central line of the curved portion in a third direction.

The method may include cutting the flexible substrate on both sides of the central line with the cutting portion.

The curved portion may have a convex shape that protrudes outwardly from the flat portions.

The curved portion may have a concave shape that is recessed inwardly from the flat portions.

The cutting the flexible substrate by using a cutting portion may cause a cross-section of the flexible substrate to have an inclined surface.

The forming of the display device may include forming display devices in a plurality of display areas on the flexible substrate, and the cutting of the flexible substrate may include cutting portions between the plurality of display areas.

According to an exemplary embodiment, it is possible to prevent, or reduce the likelihood of, a substrate from being damaged during a substrate cutting operation.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

As the inventive concept allows for various changes and numerous embodiments, exemplary embodiments are illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of the related art may be omitted when it is deemed that they may unnecessarily obscure the essence of the inventive concept.

While terms such as "first," "second," etc., may be used to describe various elements, components, regions, layers and/or sections, these elements, components, regions, layers and/or sections should not be limited to the above terms. The above terms are used only to distinguish one element, component, region, layer, and/or section from another. Thus, a first element, component, region, layer or section described below could be termed a second element, component, region, layer or section, without departing from the spirit and scope of the present invention.

The terms used in the present specification are merely used to describe exemplary embodiments, and are not intended to limit the inventive concept. An expression used in the singular encompasses the expression of the plural, unless it has a clearly different meaning in the context. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, in the drawings, components may have been exaggerated or omitted or schematically illustrated for convenience of description and clarity, and the size of each component does not necessarily reflect an actual size.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In describing each component, when it is referred that the component is formed "on" or "under" another component, it can be directly on or under the other component, or one or more intervening components may be present. In addition, it will also be understood that when a component is referred to as being "between" two components, it can be the only component between the two components, or one or more intervening components may also be present. As used herein, the terms "on" and "under" are described with reference to the drawings.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, exemplary embodiments are described in detail with reference to the accompanying drawings. Unless otherwise noted, like reference numerals denote like elements throughout the attached drawings and the written description, and thus, descriptions thereof will not be repeated.

Figure 1:
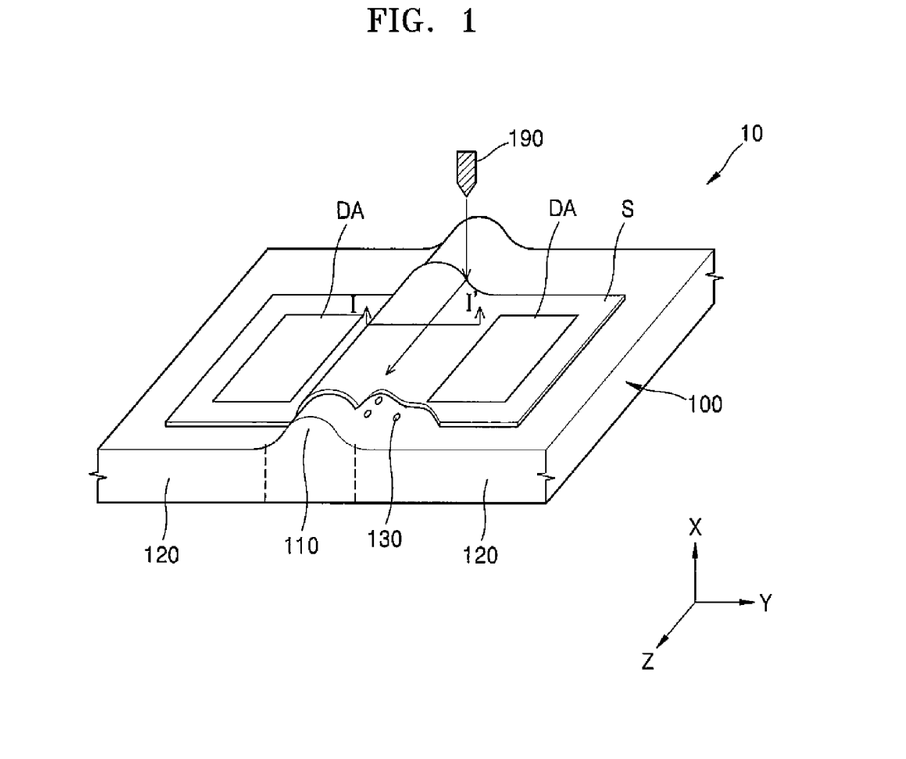
FIG. 1 is a schematic perspective view illustrating a substrate cutting apparatus according to one or more exemplary embodiments of the present invention.
Figure 2:
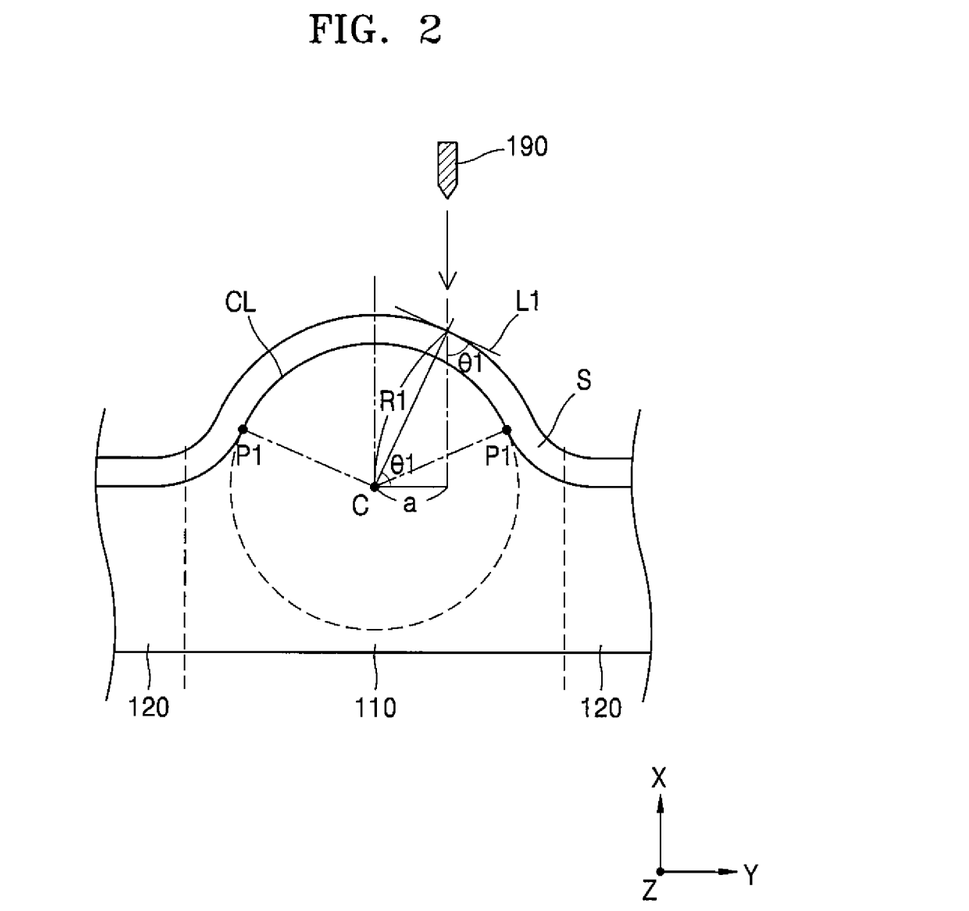
FIG. 2 is a schematic cross-sectional view illustrating a cross-section taken along the line 14 of the substrate cutting apparatus of FIG. 1.
Figure 3:
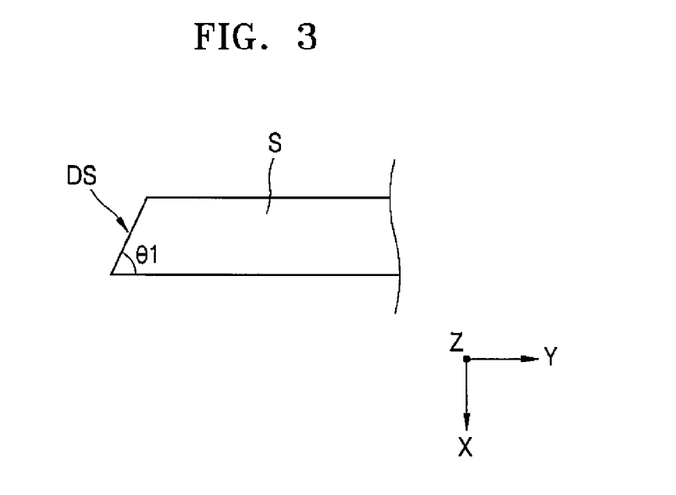
FIG. 3 is a schematic cross-sectional view illustrating a substrate cut by the substrate cutting apparatus of FIG. 1.

FIG. 1 is a schematic perspective view illustrating a substrate cutting apparatus 10 according to one or more exemplary embodiments of the present invention, FIG. 2 is a schematic cross-sectional view illustrating a cross-section taken along the line I-I' of the substrate cutting apparatus 10 of FIG. 1, and FIG. 3 is a schematic cross-sectional view illustrating a substrate cut by the substrate cutting apparatus 10 of FIG. 1.

Referring to FIGS. 1 to 3, the substrate cutting apparatus 10 according to one or more exemplary embodiments may include a stage 100 on which a substrate S is disposed, and a cutting portion 190 positioned above the stage 100 for cutting the substrate S.

The substrate S, which is an object used in a process of preparing a display device, may be a flexible substrate. A plurality of display areas DA may be formed in (or on) the substrate S. The display areas DA may include organic light-emitting devices or liquid crystal devices, etc. In addition, the substrate S may be fixed on the stage 100 with a clamp, etc. so that the position of the substrate S on the stage 100 may be fixed.

The stage 100 may include at least one curved portion 110, and may include flat portions 120 on both (or opposing) sides of the curved portion 110 that are continuously formed with the curved portion 110. A height of the flat portions 120 on both sides of the curved portion 110 may be the same, and the plurality of display areas DA formed in (or on) the substrate S may be on the flat portions 120.

The curved portion 110 may extend along a first direction (e.g., a z-axis direction). The curved portion 110 may include a central line C (see FIG. 2) that extends along the first direction (z-axis direction), and may have a bilateral symmetric shape about the central line C. The central line C may be any line on a plane that divides the curved portion 110 such that the curved portion 110 has bilateral symmetry, but hereinafter, for convenience of description, on the assumption that at least a portion of the curved portion 110 has a predetermined radius of curvature, the central line C is referred to as a line that passes through the center of curvature.

A plurality of vacuum holes 130 may be formed in (or defined by) the stage 100. The substrate S having flexibility may be closely attached to the curved portion 110 and the flat portions 120 via the vacuum holes 130.

The cutting portion 190 may cut through the substrate S in a second direction (e.g., a vertical direction or an x-axis direction). The cutting portion 190 may include a laser oscillator that irradiates a laser beam, or may include a cutting wheel.

The cutting portion 190 may cut the substrate S along the first direction (z-axis direction) in which the curved portion 110 extends, and may be located at a position spaced apart in a third direction (e.g., a horizontal direction or a y-axis direction) from the central line C of the curved portion 110. As such, in some embodiments, the position of the stage 100 may be fixed, and the cutting portion 190 may move along the first direction (z-axis direction) to cut the substrate S. In some embodiments, the position of the cutting portion 190 may be fixed, and the stage 100 may move.

The cutting portion 190 may cut the substrate S at a position that overlaps the curved portion 110. As such, a cut surface of the substrate S may include an inclined surface. Hereinafter, a method of cutting the substrate S is described in more detail with reference to FIGS. 2 and 3.

The curved portion 110 may have, for example, a convex shape that protrudes to the outside relative to the flat portions 120. Also, a cross-section (e.g., an x-y plane) of the curved portion 110 that is perpendicular to the first direction (z-axis direction) may include a curve CL. The curve CL may include two inflection points P1 that are respectively formed on opposing sides of the central line C. That is, the curve CL may continuously change (e.g., continuously change along the z-axis direction) from a convex shape to a concave shape at the inflection point P1, and thus the occurrence of folding, etc. at the substrate S that is closely attached to the stage 100 may be prevented (or the likelihood thereof may be reduced).

The curve CL may be formed to have a radius of curvature (e.g., a predetermined radius of curvature) between the two inflection points P1. Also, when the cutting portion 190 cuts the substrate S in the second direction (x-axis direction) between the two inflection points P1, the cut surface of the substrate S may have an inclined surface DS, and a cutting angle θ1 of the substrate S may be easily adjusted.

For example, as illustrated in FIG. 2, when the substrate S is closely attached to the curved portion 110, when a shortest distance from the central line C of the curved portion 110 to the outer surface of the substrate S forms a radius of curvature R1, and when the position of the cutting portion 190 is spaced apart in the third direction (y-axis direction) by a distance "a" from the central line C of the curved portion 110, a segment that connects a point at which cutting of the substrate S starts and the central line C may form an angle θ1 with the horizontal direction (y-axis direction). In this case, an angle formed by a tangent line L1 at the point at which the cutting of the substrate S starts and the first direction (z-axis direction) in which the substrate S is cut by the cutting portion 190 becomes θ1. In other words, θ1 is the cutting angle θ1 of a cut surface of the substrate S.

Therefore, the substrate S may be cut obliquely to have an inclined surface DS (see FIG. 3) by simply cutting the substrate S in a vertical direction without inclining the stage 100 or the cutting portion 190, and by doing so, it is possible to prevent (or reduce the likelihood of) damage from occurring at an inorganic layer, etc. that is formed on the substrate S. Also, the cutting angle θ1 of the substrate S may be easily adjusted depending on the distance a.

The cutting portion 190 may cut the substrate S on both sides of the central line C. Though FIG. 2 illustrates an example in which the cutting portion 190 cuts the substrate S at a position spaced from the central line C in the third direction, in some embodiments, the cutting portion 190 may cut the substrate S at a position spaced apart in the third direction on an opposite side of the central line C. In this case, the cutting portion 190 may sequentially cut the substrate S on both sides of the central line C, and/or the cutting portion 190 may be provided in plural and may simultaneously cut the substrate S on both sides of the central line C.

Also, even when the cutting portion 190 cuts the substrate S at a position spaced in the third direction on the opposite side of the central line C, the cutting angle θ1 of the substrate S may be easily adjusted depending on the position of the cutting portion 190 that is spaced apart from the central line C.

Figure 4:
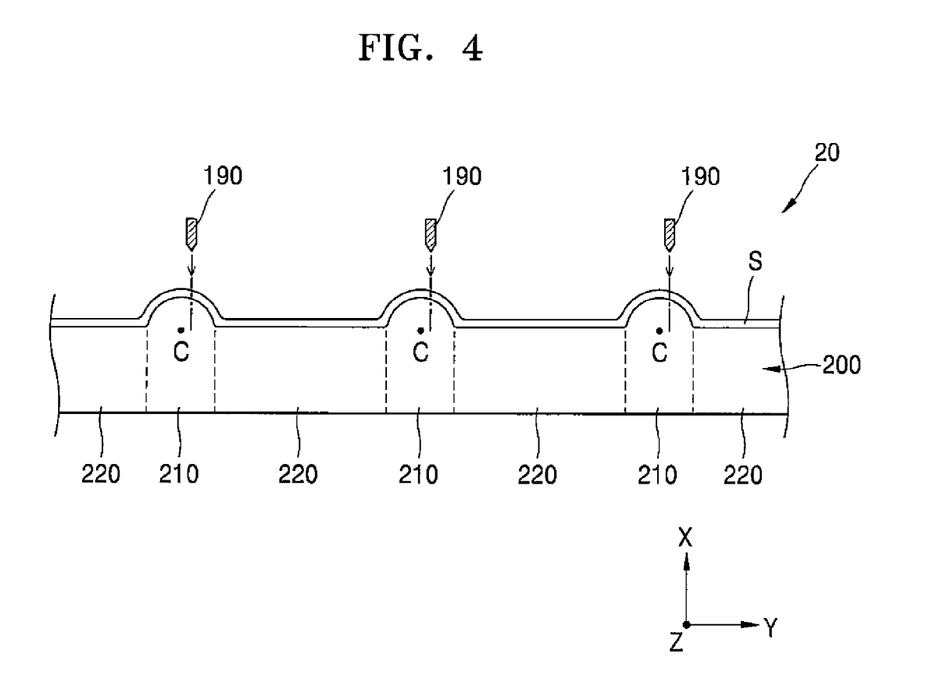
FIG. 4 is a schematic cross-sectional view illustrating a modified example of the substrate cutting apparatus of FIG. 1.

FIG. 4 is a schematic cross-sectional view illustrating a modified example of the substrate cutting apparatus of FIG. 1.

Referring to FIG. 4, a substrate cutting apparatus 20 may include a stage 200 on which a substrate S is located, and a cutting portion 190 positioned above the stage 200 for cutting the substrate S. Compared with the substrate cutting apparatus 10 of FIG. 1, the substrate cutting apparatus 20 of FIG. 4 includes a plurality of curved portions 210 and a plurality of cutting portions 190.

The substrate S has flexibility and may be disposed on the stage 200 along a shape formed by the plurality of curved portions 210 and flat portions 220.

The plurality of curved portions 210 may extend in parallel along the first direction (z-axis direction), and may be spaced apart from each other. The plurality of flat portions 220 that are continuously formed with the plurality of curved portions 210 may be formed between the plurality of curved portions 210.

Each of the plurality of curved portions 210 may include the central line C, and may have bilateral symmetry about a corresponding central line C.

The plurality of cutting portions 190 may respectively cut the substrate S at positions corresponding to the plurality of curved portions 210. The plurality of cutting portions 190 may be concurrently driven, simultaneously driven, or independently driven. Each of the plurality of cutting portions 190 may cut the substrate S in the second direction (x-axis direction) at a position spaced apart in the third direction (y direction) from the central line C of the corresponding curved portions 110. Therefore, a cut surface of the substrate S may have an inclined surface DS.

Also, the substrate cutting apparatus 20 of FIG. 4 may concurrently or sequentially cut the substrate S on both sides of respective central lines C included in the plurality of curved portions 210.

Figure 5:
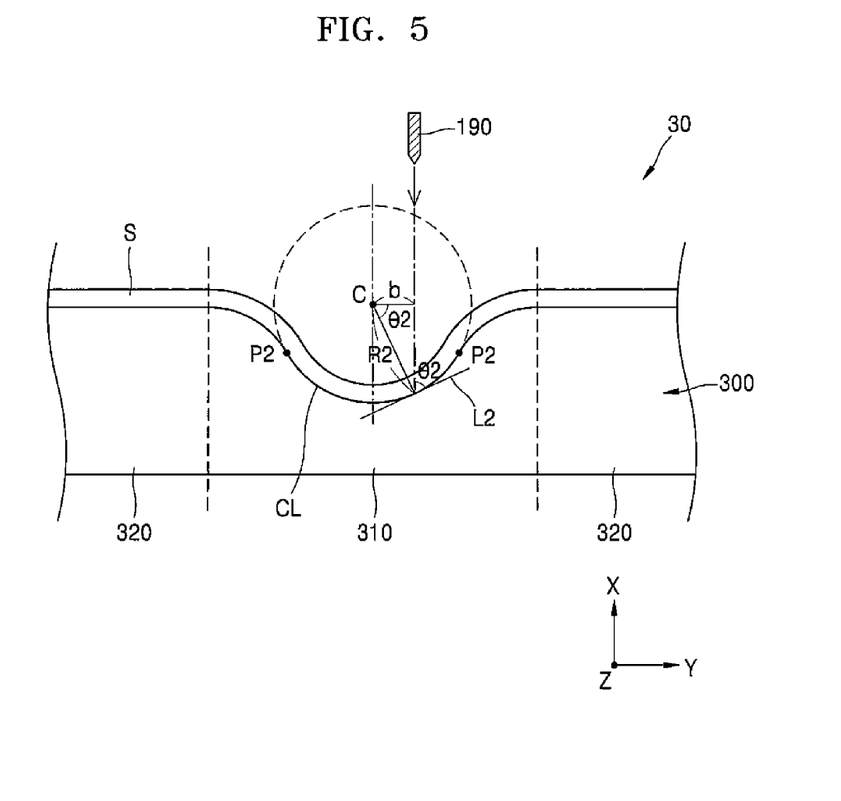
FIG. 5 is a schematic cross-sectional view illustrating another modified example of the substrate cutting apparatus of FIG. 1.

FIG. 5 is a schematic cross-sectional view illustrating another modified example of the substrate cutting apparatus of FIG. 1.

Referring to FIG. 5, a substrate cutting apparatus 30 may include a stage 300 on which a substrate S is disposed, and a cutting portion 190 positioned above the stage 300 for cutting the substrate S. Because the substrate S and the cutting portion 190 illustrated in FIG. 5 are substantially the same as those illustrated and described with reference to FIGS. 1 to 3, repeated descriptions thereof may be omitted.

The stage 300 may include at least one curved portion 310 that extends along the first direction (z-axis direction), and flat portions 320 on both sides of the curved portion 310 that are continuously formed with the curved portion 310.

The curved portion 310 may have, for example, a concave shape that is recessed into the stage 300 in comparison to the flat portions 320 (e.g., recessed inwardly from the flat portions 320), and the curved portion 310 of the concave shape that extends along the first direction (z-axis direction) may include a central line C. Also, a cross-section (e.g., with respect to the x-y plane) of the curved portion 310 that is perpendicular to the first direction (z-axis direction) may include a curve CL.

The curve CL may include two inflection points P2 that are respectively formed on opposing sides of the central line C. The curve CL may continuously change (e.g., along the z-axis direction) from a concave shape to a convex shape at the inflection point P2. Therefore, occurrence of folding, etc. at the substrate S on the stage 300 may be prevented, or the likelihood thereof may be reduced.

The curve CL may be formed to have a radius of curvature (e.g., a predetermined radius of curvature) between the two inflection points P2. For example, as illustrated in FIG. 5, when the substrate S is closely attached to the curved portion 310, when a shortest distance from the central line C of the curved portion 310 to the surface of the curved portion 310 forms a radius of curvature R2, and when the cutting portion 190 cuts the substrate S at a position spaced from the central line C of the curved portion 310 in the third direction (y-axis direction) by a distance b, a segment that connects a point at which the cutting of the substrate S ends with the central line C forms an angle θ2 with the third direction (y-axis direction). In this case, θ2 is an angle that is formed by a tangent line L2 at a point at which the cutting of the substrate S ends and a cut direction (e.g., the x-axis direction) of the substrate S, so that θ2 may become a cutting angle θ2 of a cut surface of the substrate S.

Therefore, when the cutting portion 190 cuts the substrate S in the second direction (x-axis direction) between the two inflection points P2, the substrate S may be cut obliquely, and the cutting angle θ2 may be easily adjusted by adjusting the distance b.

The cutting portion 190 may cut the substrate S on both sides of the central line C. Though FIG. 5 illustrates an example in which the cutting portion 190 cuts the substrate S at a position spaced from the central line C in the third direction, the cutting portion 190 may cut the substrate S at a position spaced apart in the third direction on an opposite side of the central line C. In this case, the cutting portion 190 may sequentially cut the substrate S on both sides of the central line C, and/or the cutting portion 190 may be provided in plural and may concurrently cut the substrate S on both sides of the central line C.

Hereinafter, a method of manufacturing a display device by using a substrate cutting apparatus according to one or more exemplary embodiments of the present invention is briefly described with reference to FIGS. 1 to 3.

The method of manufacturing the display device according to one or more exemplary embodiments of the present invention includes forming the display device on the flexible substrate S, disposing the flexible substrate S on the stage 100, and cutting the flexible substrate S by using the cutting portion 190.

The stage 100 may include at least one curved portion 110 that extends along the first direction (z-axis direction), and the flat portions 120 respectively disposed on both sides of the curved portion 110 and continuously formed with the curved portion 110. A plurality of vacuum holes 130 may be formed in the stage 100. As such, the flexible substrate S may be closely attached to the curved portion 110 and the flat portions 120 according to the shapes of the curved portion 110 and the flat portions 120 and thus the position of the flexible substrate S may be fixed.

The cutting portion 190 cuts the flexible substrate S in the second direction (e.g., the vertical direction or x-axis direction) at a position that overlaps with the curved portion 110 as described above. In this case, the cutting portion 190 cuts the flexible substrate S at a position that is moved in the third direction from the central line C of the curved portion 110, and thus the flexible substrate S may be cut to have the inclined surface DS.

The flexible substrate S may be cut with the same effect by utilizing the substrate cutting apparatus 20 of FIG. 4, the substrate cutting apparatus 30 of FIG. 5, and/or the substrate cutting apparatus 10 of FIGS. 1 and 2.

The operation of forming the display device is an operation of forming display devices in a plurality of display areas DA on the flexible substrate S, and the operation of cutting the flexible substrate S is an operation of cutting portions between the plurality of display areas DA, so that a plurality of display devices may be formed.

Figure 6:
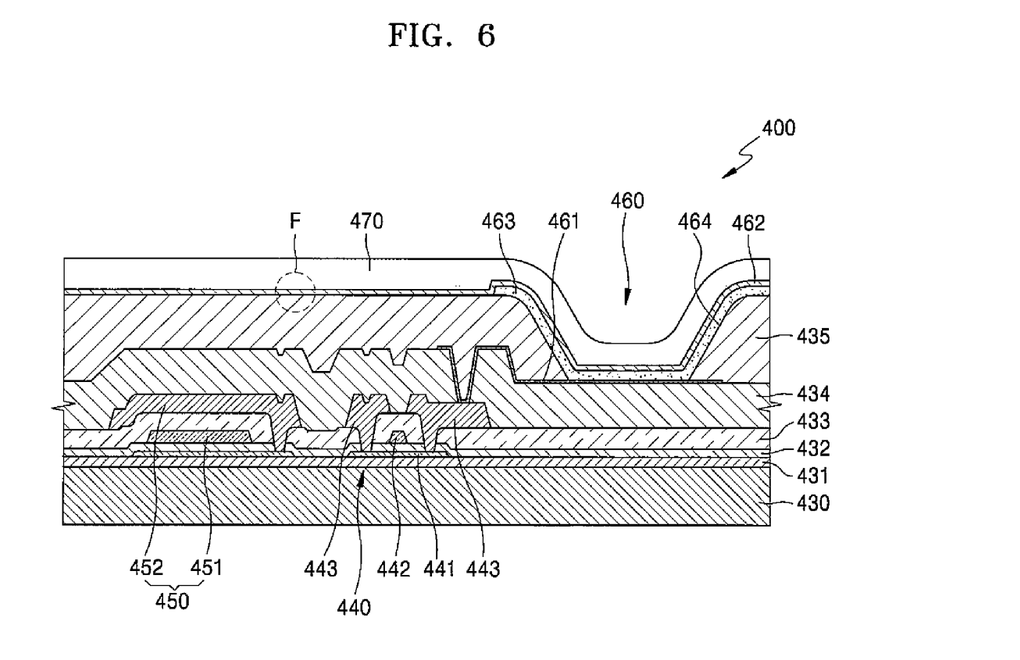
FIG. 6 is a schematic cross-sectional view illustrating a display device manufactured by a substrate cutting apparatus.
Figure 7:
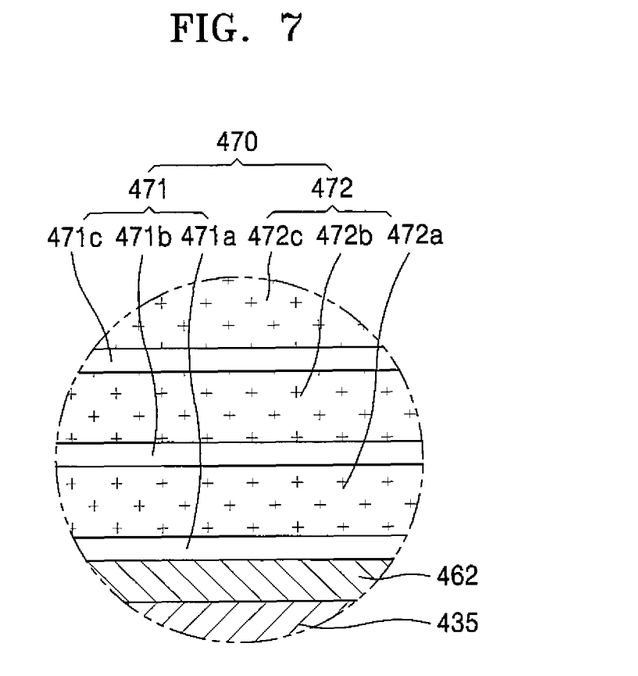
FIG. 7 is a schematic enlarged view illustrating the portion F of FIG. 6.

FIG. 6 is a schematic cross-sectional view illustrating a display device manufactured by a substrate cutting apparatus, and FIG. 7 is a schematic enlarged view illustrating the portion F of FIG. 6. Though FIGS. 6 and 7 illustrate a display device that includes an organic light-emitting device as an example, exemplary embodiments of the inventive concept are not limited thereto, and the display device may include a liquid crystal device, for example.

Referring to FIGS. 6 and 7, an organic light-emitting display device 400 is formed on a substrate 430. The substrate 430 may include a material having flexibility. For example, the substrate 430 may include polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), cellulose acetate propionate (CAP), etc.

A buffer layer 431 that provides a flat surface on the upper portion of the substrate 430 and that includes an insulating material that prevents or substantially prevents moisture and foreign substances from penetrating into the substrate 430 may be formed on the substrate 430.

A thin film transistor (TFT) 440, a capacitor 450, and an organic light-emitting device 460 may be formed on the buffer layer 431. The TFT 440 roughly includes an active layer 441, a gate electrode 442, and source/drain electrodes 443. The organic light-emitting device 460 includes a first electrode 461, a second electrode 462, and an intermediate layer 463. The capacitor 450 includes a first capacitor electrode 451 and a second capacitor electrode 452.

Specifically, the active layer 441 having a pattern (e.g., that is formed in a predetermined pattern) is on the upper portion of the buffer layer 431. The active layer 441 may include an inorganic semiconductor material such as silicon, an organic semiconductor material, and/or an oxide semiconductor material, and may be formed by injecting p-type or n-type dopants. A gate insulating layer 432 is formed on the upper portion of the active layer 441. The gate electrode 442 is formed on the upper portion of the gate insulating layer 432 to correspond to the active layer 441. The first capacitor electrode 451 is formed in the layer in which the gate electrode 442 is formed and may include the same material as that of the gate electrode 442.

An interlayer insulating layer 433 is formed to cover the gate electrode 442, and the source/drain electrodes 443 are formed on the interlayer insulating layer 433 and on contact regions (e.g., predetermined regions) of the active layer 441. The second capacitor electrode 452 is formed at the layer at which the source/drain electrodes 443 are formed, and may include the same material as those of the source/drain electrodes 443.

A passivation layer 434 is formed to cover the source/drain electrodes 443, and a separate insulating layer for planarizing the TFT 440 may be further formed on the upper portion of the passivation layer 434.

The first electrode 461 is formed on the passivation layer 434, and is electrically connected with one of the source/drain electrodes 443. Also, a pixel-defining layer 435 is formed to cover the first electrode 461. A predetermined opening 464 is formed in the pixel-defining layer 435, and then the intermediate layer 463 including an organic emission layer is formed inside a region limited by the opening 464. The second electrode 462 is formed on the intermediate layer 463 (and on the pixel-defining layer 435, for example).

An encapsulation layer 470 is formed on the second electrode 462. The encapsulation layer 470 may include an organic material or an inorganic material, and may have a structure in which an organic material and an inorganic material are stacked in turns.

For example, the encapsulation layer 470 may include an inorganic layer 471 and an organic layer 472, wherein the inorganic layer 471 includes a plurality of layers 471a, 471b, and 471c, and the organic layer 472 includes a plurality of layers 472a, 472b, and 472c.

As described above, the organic light-emitting display portion formed on the substrate 430 includes a plurality of thin films, and the buffer layer 431, the gate insulating layer 432, the interlayer insulating layer 433, the encapsulation layer 470, etc. among the thin films may include an inorganic layer or a layer including an inorganic layer. These layers may be formed between the plurality of display areas DA (see FIG. 1). Therefore, these layers may be cut by the substrate cutting apparatus 10, 20, or 30.

Because the inorganic layer has a characteristic that is vulnerable to external impact, when the inorganic layer is cut such that the inorganic layer has a vertical cross-section, the inorganic layer may be damaged. However, in the substrate cutting apparatus 10, 20, or 30 according to one or more exemplary embodiments of the present invention, the cutting portion 190 cuts the substrate 430 in the second direction (e.g., the vertical direction or the x-axis direction), but the substrate 430 is cut such that the substrate 430 has an inclined (e.g., oblique inclined) surface. Also, a cutting angle of the substrate 430 may be easily adjusted. Therefore, because it is not required to either incline the stage on which the substrate 430 is disposed, or adjust a cutting angle of the cutting portion, to cut the substrate 430 obliquely, a process of manufacturing a display device may be simplified, and inorganic layers that are formed on the substrate 430 are prevented from being damaged.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A substrate cutting apparatus comprising:
    a stage configured to support a substrate and comprising:
        at least one curved portion that extends along a first direction; and
        flat portions respectively on sides of the curved portion and continuous with the curved portion; and
    a cutting portion above the stage and configured to cut the substrate in a second direction and along the first direction at a position spaced from a central line of the curved portion in a third direction.

2. The apparatus of claim 1, wherein the cutting portion is configured to cut the substrate at a position that overlaps with the curved portion.

3. The apparatus of claim 1, wherein the curved portion has a convex shape that protrudes outwardly from the flat portions.

4. The apparatus of claim 1, wherein the curved portion has a concave shape recessed inwardly from the flat portions.

5. The apparatus of claim 1, wherein the curved portion has bilateral symmetry about the central line.

6. The apparatus of claim 1, wherein a cross-section of the curved portion, the cross-section being perpendicular to the first direction, comprises a curve comprising two inflection points respectively formed at opposing sides of the central line.

7. The apparatus of claim 6, wherein the curve has a first curvature between the two inflection points.

8. The apparatus of claim 6, wherein the cutting portion is configured to cut the substrate between the two inflection points.

9. The apparatus of claim 1, wherein the stage comprises a plurality of vacuum holes.

10. The apparatus of claim 1, wherein the substrate comprises a flexible substrate, and wherein a cross-section of the substrate that is cut by the cutting portion has an inclined surface.

11. The apparatus of claim 1, wherein the cutting portion is configured to cut the substrate on opposing sides of the central line.

12. The apparatus of claim 1, wherein the at least one curved portion comprises a plurality of curved portions spaced apart from each other.

13. A method of manufacturing a display device, the method comprising:
    forming the display device on a flexible substrate;
    disposing the flexible substrate on a stage; and
    cutting the flexible substrate by using a cutting portion,
    wherein the stage comprises:
        at least one curved portion that extends along a first direction; and
        flat portions respectively on opposing sides of the curved portion and continuous with the curved portion, and
    wherein the cutting portion cuts the flexible substrate in a second direction at a position that overlaps with the curved portion.

14. The method of claim 13, further comprising closely attaching the flexible substrate to the curved portion and to the flat portions by vacuum holes defined by the stage.

15. The method of claim 13, further comprising cutting the flexible substrate with the cutting portion along the first direction at a position spaced from a central line of the curved portion in a third direction.

16. The method of claim 15, further comprising cutting the flexible substrate on both sides of the central line with the cutting portion.

17. The method of claim 13, wherein the curved portion has a convex shape that protrudes outwardly from the flat portions.

18. The method of claim 13, wherein the curved portion has a concave shape that is recessed inwardly from the flat portions.

19. The method of claim 13, wherein the cutting the flexible substrate by using a cutting portion causes a cross-section of the flexible substrate to have an inclined surface.

20. The method of claim 13, wherein the forming of the display device comprises forming display devices in a plurality of display areas on the flexible substrate, and
    wherein the cutting of the flexible substrate comprises cutting portions between the plurality of display areas.

* * * * *